(12) United States Patent
Chuang

(10) Patent No.: US 8,164,752 B2
(45) Date of Patent: Apr. 24, 2012

(54) ALIGNMENT APPARATUS FOR ALIGNING MULTI-LAYER STRUCTURES

(75) Inventor: Hsin-Hung Chuang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 587 days.

(21) Appl. No.: 12/421,712

(22) Filed: Apr. 10, 2009

(65) Prior Publication Data

US 2009/0257036 A1 Oct. 15, 2009

(30) Foreign Application Priority Data

Apr. 11, 2008 (CN) .......................... 2008 1 0301050

(51) Int. Cl.
*G01B 11/00* (2006.01)
(52) U.S. Cl. .................. 356/401; 356/399; 356/400
(58) Field of Classification Search ........... 356/399–401
See application file for complete search history.

(56) References Cited

U.S. PATENT DOCUMENTS 7,629,697 B2 * 12/2009 Van Haren et al. ........... 257/797

FOREIGN PATENT DOCUMENTS

| CN | 1215221 A | 4/1999 |
|---|---|---|
| KR | 20020090813 A | 12/2002 |

OTHER PUBLICATIONS

R. W. Bower, M. S. Ismail, and S. N. Farrens, Aligned Wafer Bonding: A Key to Three Dimensional Microstructures, Journal of Electronic Materials, vol. 20, No. 5, 1991, Dept. Electrical Engineering and Computer Science University of California, Davis, Ca. 95616, Department of Mechanical Engineering, Material Science University of California, Davis, Ca. 95616.

* cited by examiner

*Primary Examiner* — Layla Lauchman
(74) *Attorney, Agent, or Firm* — Altis Law Group, Inc.

(57) ABSTRACT

An exemplary alignment apparatus can align a first layer with a second layer. The first layer has a first alignment pattern. The second layer has a second alignment pattern. The alignment apparatus includes a supporting device for supporting the first layer and the second layer, a light pervious reference plate, and a viewing and adjusting mechanism. The light pervious reference plate has a first reference pattern spatially corresponding to the first alignment pattern on the first layer, and a second reference pattern spatially corresponding to the second alignment pattern on the second layer. The viewing and adjusting mechanism is adapted for assisting a human operator to align the first reference pattern with the first alignment pattern and the second reference pattern with the second alignment pattern.

18 Claims, 3 Drawing Sheets

ALIGNMENT APPARATUS FOR ALIGNING MULTI-LAYER STRUCTURES

CROSS REFERENCE TO RELATED APPLICATION

This application is related to commonly-assigned copending application Ser. No. 12/202,598, filed Sep. 2, 2008, and entitled "METHOD FOR MANUFACTURING LENS." The disclosure of the above-identified application is incorporated herein by reference.

BACKGROUND

1. Technical Field

The present disclosure relates to alignment apparatuses, and particularly to a alignment apparatus for aligning multi-layer structures, the alignment apparatus typically applied in soft lithography technology.

2. Description of Related Art

Soft lithography refers to a family of techniques for fabricating or replicating structures. It is called "soft" because it uses elastomeric materials, most notably polydimethylsiloxane (PDMS). Multilayer soft lithography combines soft lithography with the capability to bond multiple patterned layers of elastomer. Multilayer structures are constructed by bonding layers of elastomer, each of which is separately cast from a micromachined mold.

Typically, during the process of construction of multilayer structures, the layers need to be aligned with each other. This is usually implemented by manual adjustments. The bonding process is irreversible, therefore misalignment increases the failure rate of products in manufacturing.

Therefore, an alignment apparatus for aligning multi-layer structures is desirable to overcome the above-described deficiencies.

BRIEF DESCRIPTION OF THE DRAWINGS

Many aspects of various preferred and exemplary embodiments can be better understood with reference to the following drawings. The components in the drawings are not necessarily drawn to scale, the emphasis instead being placed upon clearly illustrating the principles of the embodiments. Moreover, in the drawings, all the views are schematic, and like reference numerals designate corresponding parts throughout the several views.

DETAILED DESCRIPTION

Embodiments will now be described in detail below, with reference to the drawings.

Figure 1:
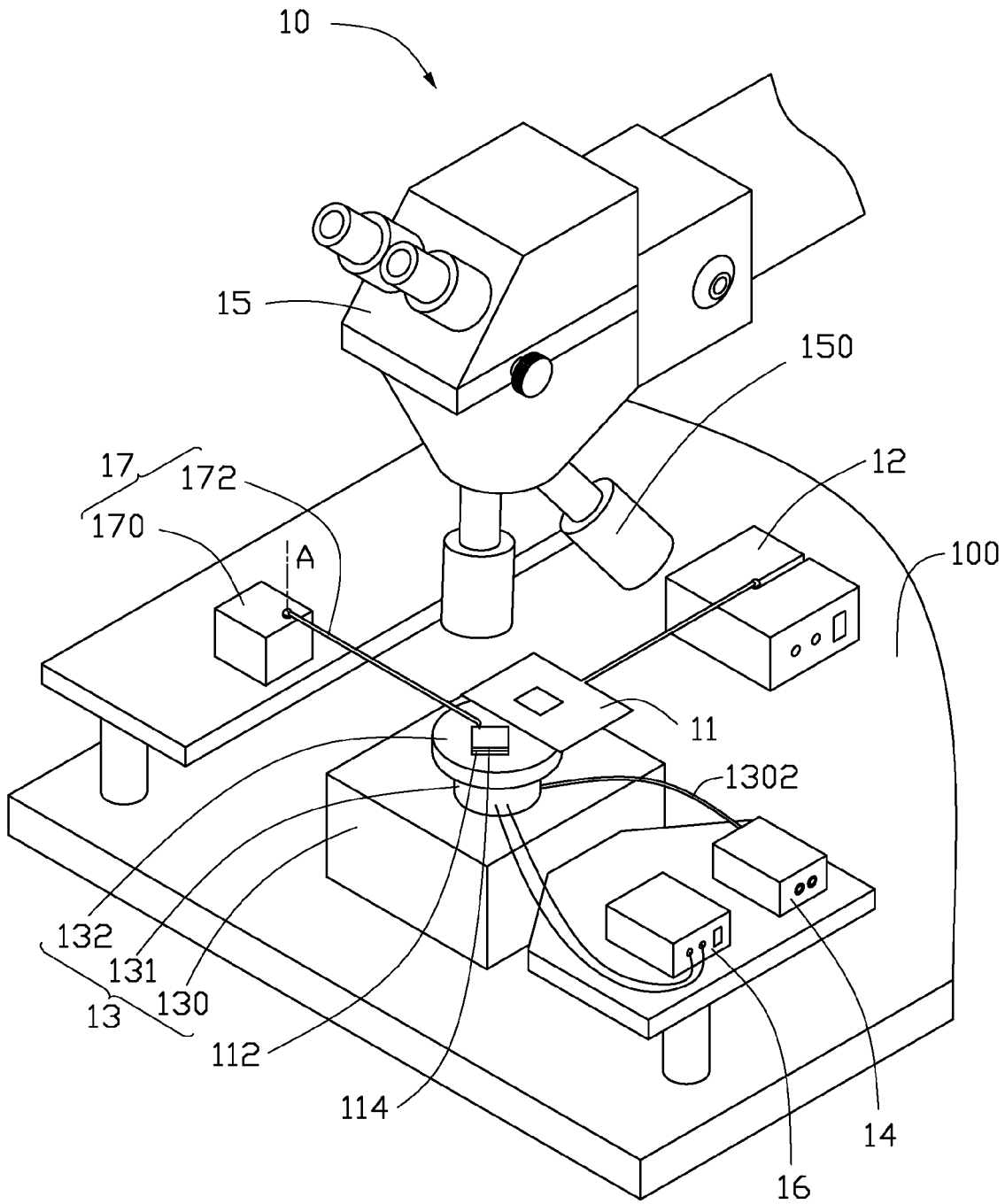
FIG. 1 is an isometric view of an exemplary embodiment of an alignment apparatus together with two layers being aligned, the alignment apparatus including a supporting device, a vacuum pump, and a reference plate.
Figure 2:
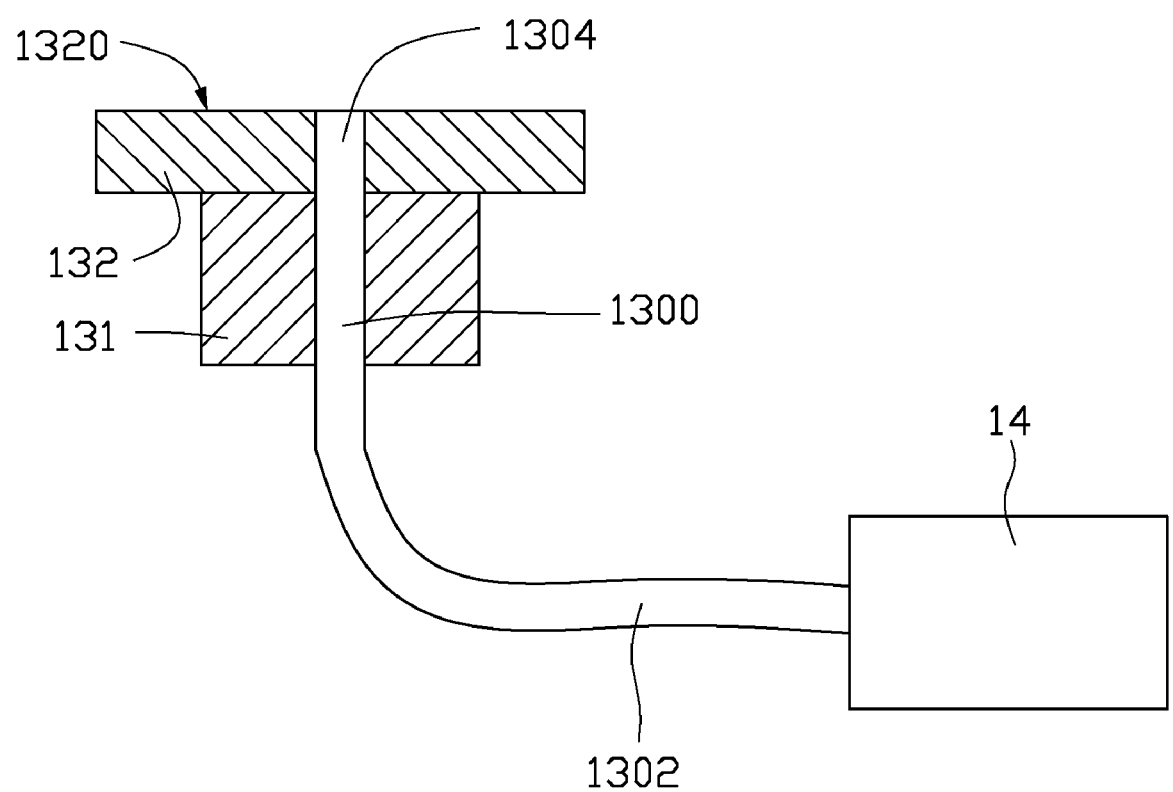
FIG. 2 is a cross-sectional view of the supporting device of FIG. 1, showing the supporting device in communication with the vacuum pump.

Referring to FIG. 1 and FIG. 2, an alignment apparatus 10 for aligning multi-layer structures, according to an exemplary embodiment, includes a worktable 100, a light pervious reference plate 11, a driving device 12, a supporting device 13, a vacuum pump 14, and an optical magnifier 15. The driving device 12 and the supporting device 13 are mounted on the worktable 100. The vacuum pump 14 is coupled to the supporting device 13 via a pipe 1302. The driving device 12 is configured for driving the reference plate 11 to move relative to the supporting device 13. In particular, the driving device 12 can drive the reference plate 11 to move to a position above the supporting device 13, between the optical magnifier 15 and the supporting device 13.

The supporting device 13 includes a lower fixed plate 130 mounted on the worktable 100, an upper movable plate 131 on the fixed plate 130, and a heating plate 132 on the movable plate 131. The movable plate 131 can move horizontally relative to the worktable 100 in an XY-plane. In one embodiment, the movable plate 131 can also rotate in the XY-plane. In another embodiment, the movable plate 131 can also move in vertical directions. The heating plate 132 includes a supporting surface 1320. A through hole 1300 is defined in the supporting surface 1320, with the through hole 1300 passing through the heating plate 132 and the movable plate 131. A top of the through hole 1300 at the supporting surface 1320 is an opening 1304. Referring to FIG. 2, the through hole 1300 is in communication with the vacuum pump 14 via the pipe 1302. The heating plate 132 can be electrically connected with an external power supply 16. When the power supply 16 applies electric current to the heating plate 132, the heating plate 132 is heated.

The optical magnifier 15 includes a plurality of lens barrels 150 with different magnifications. Each of the lens barrels 150 can be rotated to a position where it faces the supporting surface 1320. The optical magnifier 15 may for example be a microscope.

Figure 3:
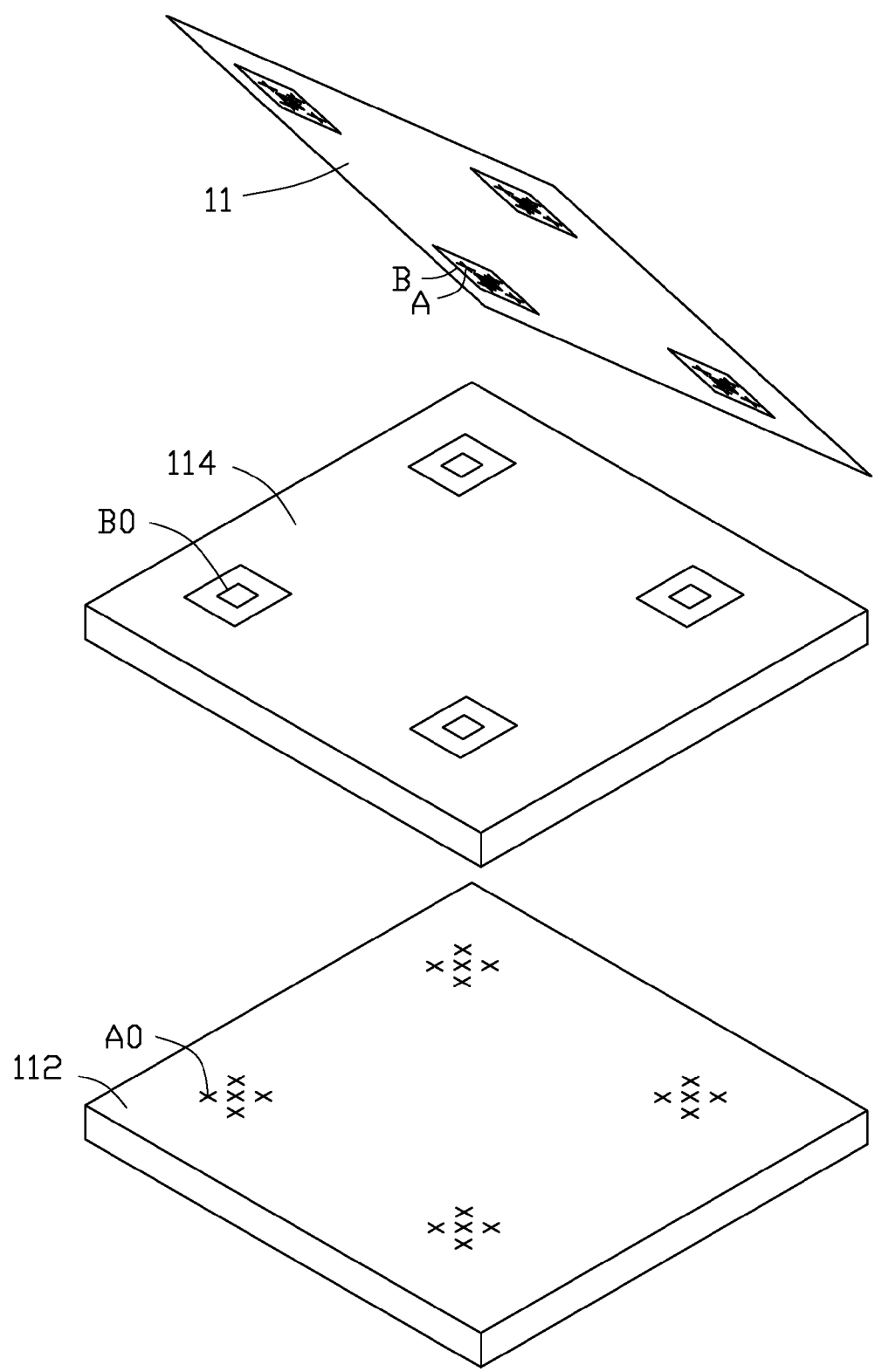
FIG. 3 is an enlarged, exploded, isometric view of the reference plate, the second layer, and the first layer of FIG. 1.

Referring also to FIG. 3, the alignment apparatus 10 is adapted for aligning a first layer 112 with a second layer 114 during a soft lithography process. The first layer 112 includes a first alignment pattern A0 formed thereon, and the second layer 114 includes a second alignment pattern B0 formed thereon. The reference plate 11 includes a first reference pattern A spatially corresponding to the first alignment pattern A0 on the first layer 112, and a second reference pattern B spatially corresponding to the second alignment pattern B0 on the second layer 114.

In the exemplary embodiment, the first layer 112 and the second layer 114 are comprised of PDMS. Typically, before the first layer 112 is placed on the supporting surface 1320 of the supporting device 13, the first layer 112 and the second layer 114 are plasma cleaned to increase their hydrophilicity.

In operation of the alignment apparatus 10, the first layer 112 is placed on the supporting surface 1320 of the supporting device 13. Thus, the opening 1304 of the through hole 1300 in the supporting surface 1320 is covered by the first layer 112, and thereby a sealed cavity is formed. The vacuum pump 16 is used to provide a pressure below atmospheric pressure in the through hole 1300 after the opening 1304 has been covered by the first layer 112. As a result, the first layer 112 is attached on the supporting surface 1320 by the creation of the partial vacuum. The reference plate 11 is driven by the driving device 12 to move relative to the supporting surface 1320. During this process, a human operator can use the optical magnifier 15 to observe the reference plate 11 and the first layer 112, and use the driving device 12 to drive the reference plate 11 to align the first reference pattern A on the reference plate 11 with the first alignment pattern A0 on the first layer 112.

Before placing the second layer 114 on the first layer 112, a few of drops of carbinol can be dropped on the first layer 112. After that, the second layer 114 is placed on the first layer 112 by a human operator or a mechanical arm. Since volatilization of carbinol needs time, the carbinol can reduce the friction between the first layer 112 and the second layer 114.

During the process of placing the second layer 114 on the first layer 112, the operator can use the optical magnifier 15 to observe the reference plate 11 and the second layer 114, and adjust the position of the second layer 114 to align the second reference pattern B on the reference plate 11 with the second alignment pattern B0 on the second layer 114. Once the first layer 112 and the second layer 114 are aligned with the reference plate 11, the alignment between the first layer 112 and the second layer 114 is finished.

After that, the first layer 112 is heated by the heating plate 132, thereby vaporizing the carbinol and bonding the first layer 112 and the second layer 114 together.

The alignment apparatus 10 can further includes a pressing device 17 mounted on the worktable 100 and configured for pressing the second layer 114 on the first layer 112. The pressing device 17 includes a base portion 170 and a pressure bar 172. The pressure bar 172 can be made of elastic material, such as plastic, copper, silver, gold, any suitable alloy containing copper, silver, or gold, etc. One end of the pressure bar 172 is pivotally mounted on the base portion 170 of the pressing device 17. The pressure bar 172 can rotate in a horizontal plane about a vertical pivot axis A. That is, the pressure bar 172 is substantially parallel to the surface of the worktable 100 when the pressure bar 172 rotates about the pivot axis A. The distance between the pressure bar 172 and the worktable 100 is smaller than the height of the supporting device 13. Thus, when a free end of the pressure bar 172 is moved above the second layer 114 and the movable plate 131 is raised, the pressure bar 172 is slightly deformed and produces an elastic pressure force applied on the second layer 114. Thereby, the second layer 114 is prevented from sliding relative to the first layer 112 after the alignment therebetween has been finished.

Unlike with conventional soft lithography technology, a human operator can use the optical magnifier 15 of the alignment apparatus 10 to align the first layer 112 and the second layer 114 with the light pervious reference plate 11, thereby ensuring accurate alignment between the first layer 112 and the second layer 114.

It is to be understood, however, that even though numerous characteristics and advantages of various embodiments have been set forth in the foregoing description together with details of the structures and functions of the embodiments, the disclosure is illustrative only; and that changes may be made in detail, especially in matters of shape, size, and arrangement of parts within the principles of the invention to the full extent indicated by the broad general meaning of the terms in which the appended claims are expressed.

What is claimed is:

1. An alignment apparatus for aligning a first layer with a second layer, the first layer having a first alignment pattern, the second layer having a second alignment pattern, the alignment apparatus comprising:
    a supporting device for supporting at least one of the first layer and the second layer;
    a light pervious reference plate having a first reference pattern spatially corresponding to the first alignment pattern on the first layer, and a second reference pattern spatially corresponding to the second alignment pattern on the second layer; and
    a viewing and adjusting mechanism configured for assisting a human operator to align the first reference pattern with the first alignment pattern and the second reference pattern with the second alignment pattern.

2. The alignment apparatus of claim 1, wherein the viewing and adjusting mechanism comprises a plurality of lens barrels with different magnifications.

3. The alignment apparatus of claim 2, wherein each of the lens barrels is selectively movable to face the supporting device.

4. The alignment apparatus of claim 1, further comprising a driving device configured for driving the light pervious reference plate to move to a position above the supporting device.

5. The alignment apparatus of claim 1, wherein the supporting device comprises a lower fixed plate, an upper movable plate on the lower fixed plate, and a heating plate on the upper movable plate, the heating plate comprising a supporting surface for supporting at least one of the first layer and the second layer.

6. The alignment apparatus of claim 5, further comprising a pressing device configured for pressing the first and second first layers together with the assistance of the supporting surface.

7. The alignment apparatus of claim 6, wherein the pressing device comprises a base portion, and a pressure bar comprised of elastic material, one end of the pressure bar is pivotally mounted on the base portion, and the pressure bar is rotatable in a horizontal plane about a pivot axis.

8. The alignment apparatus of claim 5, wherein the supporting device further comprises a through hole defined in the supporting surface and passing through the heating plate and the upper movable plate.

9. The alignment apparatus of claim 8, further comprising a vacuum pump in communication with the through hole.

10. An alignment apparatus for aligning a first layer with a second layer, the first layer having a first alignment pattern, the second layer having a second alignment pattern, the alignment apparatus comprising:
    a supporting device configured for supporting at least one of the first layer and the second layer;
    a light pervious reference plate having a first reference pattern spatially corresponding to the first alignment pattern on the first layer and a second reference pattern spatially corresponding to the second alignment pattern on the second layer;
    an optical magnifier configured for assisting a human operator to align the first reference pattern with the first alignment pattern and the second reference pattern with the second alignment pattern; and
    a driving device configured for driving the light pervious reference plate to move to a position above the supporting device between the optical magnifier and the supporting device.

11. The alignment apparatus of claim 10, wherein the optical magnifier comprises a plurality of lens barrels with different magnifications, and each of the lens barrels is selectively movable to face the supporting device.

12. The alignment apparatus of claim 10, wherein the supporting device comprises a lower fixed plate, an upper movable plate on the lower fixed plate, and a heating plate on the upper movable plate, the heating plate comprising a supporting surface for supporting at least one of the first layer and the second layer.

13. The alignment apparatus of claim 12, further comprising a pressing device configured for pressing the first and second layers together with the assistance of the supporting surface.

14. The alignment apparatus of claim 13, wherein the pressing device comprises a base portion, and a pressure bar comprised of elastic material, one end of the pressure bar is pivotally mounted on the base portion, and the pressure bar is rotatable in a horizontal plane about a pivot axis.

15. The alignment apparatus of claim 12, wherein the supporting device further comprises a through hole defined in the supporting surface and passing through the heating plate and the upper movable plate.

16. The alignment apparatus of claim 15, further comprising a vacuum pump in communication with the through hole.

17. An alignment apparatus for aligning a first layer with a second layer, the first layer having a first alignment pattern, the second layer having a second alignment pattern, the alignment apparatus comprising:
   a worktable;
   a supporting device mounted on the worktable and configured for supporting at least one of the first layer and the second layer;
   a light pervious reference plate having a first reference pattern spatially corresponding to the first alignment pattern, and a second reference pattern spatially corresponding to the second alignment pattern;
   a viewing and adjusting mechanism configured for assisting a human operator to align the first reference pattern with the first alignment pattern and the second reference pattern with the second alignment pattern; and
   a pressing device mounted on the worktable and configured for pressing the first and second layers together with the assistance of the supporting device.

18. The alignment apparatus of claim 17, wherein the pressing device comprises a base portion mounted on the worktable, and a pressure bar made of elastic material, one end of the pressure bar is pivotally mounted on the base portion, the pressure bar rotatable in a horizontal plane about a vertical pivot axis, and a distance between the pressure bar and the worktable is smaller than a height of the supporting device.

* * * * *